United States Patent
Brunschwiler et al.

(10) Patent No.: US 10,727,159 B2
(45) Date of Patent: Jul. 28, 2020

(54) COUNTER-FLOW EXPANDING CHANNELS FOR ENHANCED TWO-PHASE HEAT REMOVAL

(71) Applicant: International Business Machines Corporation, Armonk, NY (US)

(72) Inventors: Thomas J. Brunschwiler, Thalwil (CH); Timothy J. Chainer, Putnam Valley, NY (US); Evan G. Colgan, Montvale, NJ (US); Arvind Raj Mahankali Sridhar, Zurich (CH); Chin Lee Ong, Horgen (CH); Pritish R. Parida, Stamford, CT (US); Gerd Schlottig, Uitikon (CH); Mark D. Schultz, Ossining, NY (US); Joel A. Silberman, Somers, NY (US)

(73) Assignee: International Business Machines Corporatin, Armonk, NY (US)

( * ) Notice: Subject to any disclaimer, the term of this patent is extended or adjusted under 35 U.S.C. 154(b) by 0 days.

(21) Appl. No.: 16/705,278

(22) Filed: Dec. 6, 2019

(65) Prior Publication Data
US 2020/0118907 A1  Apr. 16, 2020

Related U.S. Application Data

(62) Division of application No. 16/689,445, filed on Nov. 20, 2019, which is a division of application No. (Continued)

(51) Int. Cl.
*H01L 23/473* (2006.01)
*H01L 23/427* (2006.01)
(Continued)

(52) U.S. Cl.
CPC ........ *H01L 23/427* (2013.01); *H01L 21/4871* (2013.01); *H01L 23/473* (2013.01); (Continued)

(58) Field of Classification Search
CPC .................................................. H01L 23/473
See application file for complete search history.

(56) References Cited

U.S. PATENT DOCUMENTS

| | | | |
|---|---|---|---|
| 5,138,765 A | 8/1992 | Watson |
| 5,568,835 A | 10/1996 | Lacount |
| (Continued) | | |

FOREIGN PATENT DOCUMENTS

| | | | |
|---|---|---|---|
| JP | 06132623 A | 5/1994 |
| KR | 100713930 B1 | 4/2007 |
| WO | 2011060186 A1 | 5/2011 |

OTHER PUBLICATIONS

Kandlikar et al., "Stabilization of Flow Boiling in Microchannels Using Pressure Drop Elements and Fabricated Nucleation Sites", Journal of Heat Transfer, Apr. 2006, vol. 128, pp. 389-396.
(Continued)

*Primary Examiner* — Peniel M Gumedzoe
*Assistant Examiner* — Christopher A Johnson
(74) *Attorney, Agent, or Firm* — L. Jeffrey Kelly

(57) ABSTRACT

A structure for cooling an integrated circuit. The structure may include; an interposer cold plate having at least two expanding channels, each expanding channel having a flow direction from a channel inlet to a channel outlet, the flow direction having different directions for at least two of the at least two expanding channels, the channel inlet having an inlet width and the channel outlet having an outlet width, wherein the inlet width is less than the outlet width.

20 Claims, 9 Drawing Sheets

Related U.S. Application Data

15/894,974, filed on Feb. 13, 2018, now Pat. No. 10,529,648, which is a division of application No. 14/976,106, filed on Dec. 21, 2015, now Pat. No. 9,941,189.

(51) Int. Cl.
*H01L 21/48* (2006.01)
*H01L 23/00* (2006.01)
*H01L 25/065* (2006.01)

(52) U.S. Cl.
CPC .............. *H01L 24/16* (2013.01); *H01L 24/17* (2013.01); *H01L 24/73* (2013.01); *H01L 25/0657* (2013.01); *H01L 2224/16145* (2013.01); *H01L 2224/16227* (2013.01); *H01L 2224/17181* (2013.01); *H01L 2224/32225* (2013.01); *H01L 2224/32245* (2013.01); *H01L 2224/73253* (2013.01); *H01L 2225/06513* (2013.01); *H01L 2225/06517* (2013.01); *H01L 2225/06565* (2013.01); *H01L 2225/06589* (2013.01); *H01L 2924/15311* (2013.01)

(56) References Cited

U.S. PATENT DOCUMENTS

| | | |
|---|---|---|
| 6,253,835 B1 | 7/2001 | Chu |
| 7,575,046 B2 | 8/2009 | Kandlikar |
| 7,835,151 B2 | 11/2010 | Olesen |
| 7,990,711 B1 | 8/2011 | Andry |
| 8,110,415 B2 | 2/2012 | Knickerbocker |
| 8,174,826 B2 | 5/2012 | El-Essawy |
| 8,363,402 B2 | 1/2013 | Brunschwiler |
| 8,493,736 B2 | 7/2013 | Oprins |
| 8,780,552 B2 | 7/2014 | El-Essawy |
| 8,797,741 B2 | 8/2014 | Altman |
| 8,869,830 B2 | 10/2014 | Tonkovich |
| 9,159,602 B2 | 10/2015 | Andry |
| 9,847,275 B2 | 12/2017 | Chainer |
| 9,941,189 B2 | 4/2018 | Brunschwiler |
| 10,083,892 B2 | 9/2018 | Chainer |
| 10,090,226 B2 | 10/2018 | Chainer |
| 10,199,309 B2 | 2/2019 | Chainer |
| 2005/0200001 A1 | 9/2005 | Joshi |
| 2005/0205241 A1 | 9/2005 | Goodson |
| 2008/0272484 A1 | 11/2008 | Myers |
| 2009/0057878 A1 | 3/2009 | Gomez |
| 2009/0057879 A1 | 3/2009 | Garrou |
| 2009/0057882 A1 | 3/2009 | Gerbsch |
| 2009/0108435 A1 | 4/2009 | Bernstein |
| 2010/0117201 A1 | 5/2010 | Ching |
| 2010/0187682 A1 | 7/2010 | Pinjala |
| 2011/0205708 A1 | 8/2011 | Andry |
| 2011/0304987 A1 | 12/2011 | Oprins |
| 2012/0105144 A1 | 5/2012 | Barowski |
| 2012/0212907 A1 | 8/2012 | Dede |
| 2012/0228779 A1 | 9/2012 | King, Jr. |
| 2012/0331433 A1 | 12/2012 | Brunschwiler |
| 2013/0025831 A1 | 1/2013 | Attinger |
| 2013/0044431 A1 | 2/2013 | Koeneman |
| 2013/0092938 A1 | 4/2013 | Knickerbocker |
| 2014/0015119 A1 | 1/2014 | Bonkohara |
| 2014/0071628 A1 | 3/2014 | Brunschwiler |
| 2014/0178736 A1 | 6/2014 | Gandhi |
| 2014/0262186 A1 | 9/2014 | Kandlikar |
| 2014/0307389 A1 | 10/2014 | Arvelo |
| 2015/0075755 A1 | 3/2015 | Arvelo |
| 2015/0198380 A1 | 7/2015 | Haj-Hariri |
| 2016/0128232 A1 | 5/2016 | Chainer |
| 2016/0343626 A1 | 11/2016 | Colosimo, Jr. |
| 2017/0133298 A1 | 5/2017 | Gutala |
| 2018/0182686 A1 | 6/2018 | Brunschwiler |
| 2018/0323132 A1 | 11/2018 | Chainer |

OTHER PUBLICATIONS

Kandlikar, "Review and Projections of Integrated Cooling Systems for Three-Dimensional Integrated Circuits", Journal of Electronic Packaging, Jun. 2014, vol. 136, pp. 024001-1-024001-11.

Kosar et al., "Suppression of Boiling Flow Oscillations in Parallel Microchannels by Inlet Restrictors", Journal of Heat Transfer, Mar. 2006, vol. 128, pp. 251-260.

Romagnoli et al., "Micro-fluidic Silicon Cooling Devices for Particle Tracking Detectors", 14th IEEE ITHERM Conference, 2014 IEEE, 8 pages.

Pending U.S. Appl. No. 16/689,445, filed Nov. 20, 2019, entitled: "Counter-Flow Expanding Channels for Enhanced Two-Phase Heat Removal", 25 pages.

IBM: List of IBM Patents or Patent Applications Treated As Related (Appendix P), Dec. 10, 2019, 2 pages.

COUNTER-FLOW EXPANDING CHANNELS FOR ENHANCED TWO-PHASE HEAT REMOVAL

STATEMENT REGARDING FEDERALLY SPONSORED RESEARCH OR DEVELOPMENT

This invention was made with United States Government support under DARPA Agreement No. FA8650-14-C-7466. THE GOVERNMENT HAS CERTAIN RIGHTS IN THIS INVENTION.

BACKGROUND

The present invention generally relates to cooling chip packages, and more particularly to cooling chip stacks by employing an onboard cooling structure.

In general, it is important to cool semiconductor chips, such as processor chips, to maintain reliable operation, reduce leakage currents, and prevent thermal damage to electronic components. It is more problematic and difficult to implement effective mechanisms for cooling 3D chip stacks as compared to singular chips, and the ability to efficiently cool a chip stack can limit the height and total power of a chip stack. Common cooling techniques for chip stacks include the use of high-performance water cooling systems on a backside of the chip stack, but this technique may not be adequate for a stack structure with many chips or a chip stack having a high-power chip on the bottom of the stack. While a water-cooled thermal interposer can be used at the bottom of the chip stack, this structure is difficult to integrate and may require isolation of thru silicon vias (TSVs) from the liquid coolant that is used. If a dielectric fluid is used as the coolant, isolation of the TSVs is not required. However, with single phase cooling, the performance of dielectric fluids is inferior to water.

Other cooling techniques include two-phase cooling in which a liquid coolant having a relatively low boiling point is used (e.g., liquid which evaporates at an operating temperature of the chips being used). With two-phase cooling in closed channels, the heated liquid evaporates to create an annular flow whereby a thin liquid film (evaporation layer) is present on the surfaces being cooled, and heated evaporated coolant flows through confined channels to outlet ports. As such, compared to pure liquid (e.g., single phase) cooling techniques, two-phase cooling can provide greater cooling ability using a much lower volume of coolant fluid, lower coolant mass flow rates and lower operating pressure drop. Advantages of two-phase cooling include the ability to select the boiling temperature of the coolant or use an expansion valve for refrigeration.

Another cooling technique includes expanding radial channels to mitigate the acceleration in the stream-wise direction of the fluid cavity. Accordingly, the pressure drop and the dry-out risk can be reduced in the heat transfer cavity. However, a central hole is required in a chip stack to feed the refrigerant into the radial expanding channels.

SUMMARY

According to one embodiment of the present invention, a structure is provided. The structure may include: an interposer cold plate having at least two expanding channels, each expanding channel having a flow direction from a channel inlet to a channel outlet, the flow direction having different directions for at least two of the at least two expanding channels, the channel inlet having an inlet width and the channel outlet having an outlet width, wherein the inlet width is less than the outlet width.

According to another embodiment of the present invention, a structure is provided. The structure may include: a single heat transfer structure thermally coupled to the chip, wherein the single heat transfer structure having two or more expanding coolant channels, the expanding coolant channels having a flow direction from a channel inlet to a channel outlet, wherein the flow direction of one of the at least two expanding coolant channels is in a different direction than another one of the at least two expanding coolant channels, and wherein the expanding channels have an inlet width less than an outlet width; and a manifold providing an inlet pathway to the channel inlet of the at least two expanding coolant channels and an outlet pathway from the channel outlet of the at least two expanding coolant channels.

According to another embodiment of the present invention, a method is provided. The method may include: bonding the electronic device to an interposer cold plate having at least two expanding channels, wherein the at least two expanding channels each include an inlet width less than an outlet width; generating a first coolant flow direction within a first expanding channel of one of the at least two expanding channels; and generating a second coolant flow direction within a second expanding channel of another one of the at least two expanding channels, wherein the first coolant flow direction and the second coolant flow direction include different flow directions.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
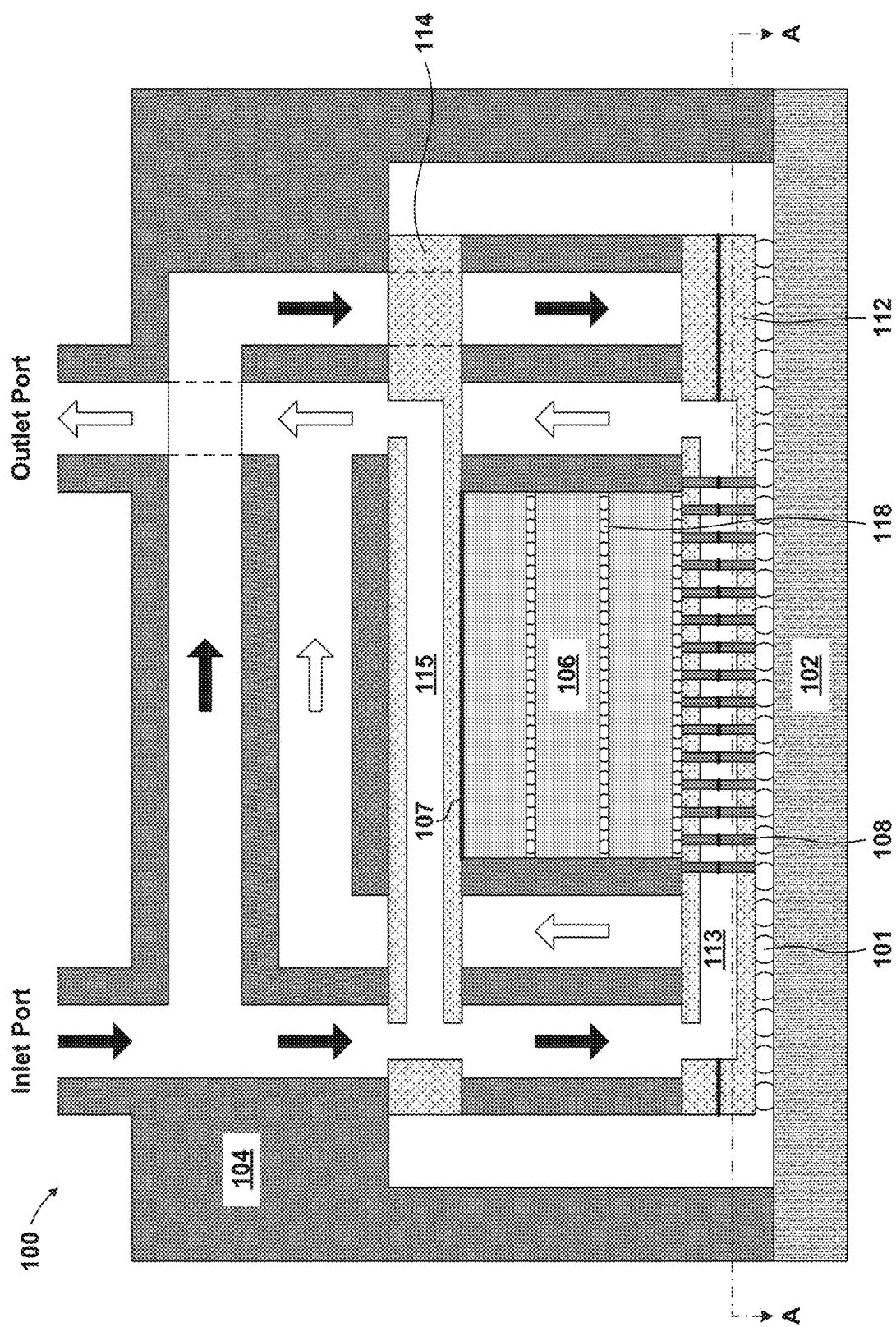
FIG. 1 is a cross section view of a cooling structure, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to cooling chip packages, and more particularly to cooling chip stacks by employing a two-phase cooling in a counter-flow arranged structure having expanding channels. Ideally, it may be desirable to fabricate an interposer cold plate and a backside cold plate that allows the heat dissipation from two sides of the chip stack, and with the advantages of expanding channels, without the need for a hole going through the chip stack (as used in, for example, radial expanding channels).

One way to fabricate the two-phase cooling structure having expanding channels is to split a fluid inlet loop and a fluid outlet loop each into two or more loops, resulting in a counter-flow heat exchange. One embodiment by which to form the two-phase counter-flow cooling structure is described in detail below referring to the accompanying drawings FIGS. 1-7.

With reference to FIG. 1, a demonstrative illustration of a structure 100 having a counter-flow cooling structure with expanding channels is provided, according to an embodiment. More specifically, an inlet loop supplies a fluid into two or more sides of an interposer cold plate 112 and a backside cold plate 114. The interposer cold plate 112 may be used alone or in combination with the backside cold plate 114 depending on cooling requirements. FIG. 1 is a cross sectional view of structure 100.

The structure 100 may include internal components, such as a chips stack 106, the interposer cold plate 112 and the backside cold plate 114. The chip stack may be cooled on one side by the interposer cold plate 112 and an opposite side by the backside cold plate 114. A manifold 104 may cover a top and side portion of the internal components, and the manifold 104 and the internal components may be bonded to a laminate 102 on a bottom portion.

The chip stack 106 may include one or more semiconductor chips vertically stacked. In an embodiment, the chip stack 106 includes three chips joined by minibumps 118. The minibumps 118 may allow for structural support as well as electrical connection between chips within the chip stack 106. Additionally, the minibumps 118 may provide a means of bonding the chip stack 106 to the interposer cold plate 112.

The interposer cold plate 112 may be any material known in the art, such as, for example, silicon and may be formed by bonding two silicon halves. The interposer cold plate 112 has two or more expanding fluid channels 113 (may also be referred to as fluid cavities). Each expanding fluid channel 113 may have a channel inlet and a channel outlet on different sides of the interposer cold plate 112. The two or more expanding fluid channels 113 may be oriented in a way to allow for counter-flow (i.e., a flow direction from channel inlet to channel outlet is oriented in a different direction than the flow direction of an adjacent expanding fluid channel 113).

In the illustrated embodiment, the backside cold plate 114 is used, such that the back side cold plate 114 and the interposer cold plate 112 cool the opposite side of the chip stack 106. The backside cold plate 114 may be any backside cold plate used in the art, or may be similar to the interposer cold plate 112 (i.e., having two or more expanding channels 115).

In the embodiment having a backside cold plate 114 and the interposer cold plate 112, a two-sided cooling system can be provided to the chips stack 106. The two-sided cold plate concept can nearly double the heat removal from the chip stack 106. For example, the backside cold plate 114 may be a metal or silicon cold plate that is attached to the chip stack 106 using a thermal interface material (TIM) 107 to allow for heat transfer from the chip stack 106. The backside cold plate 114 may also be used to preheat liquid intended to enter further cooling elements, such as the interposer cold plate 112. The expanding fluid channels 113, 115 may be defined by channel walls 122 (illustrated in FIG. 2).

The chip stack 106 may be thermally connected to TSVs 108, where the TSVs 108 pass through the interposer cold plate 112. In addition to the thermal properties of the TSVs 108, the TSVs 108 may allow for both structural support and electrical connection to the chips stack 106. The TSVs 108 may electrically connect the chip stack 106 to the laminate 102 through solder balls 101 (e.g. micro BGA or C4). The solder balls 108 may also provide a means of bonding the interposer cold plate 112 to the laminate 102. The laminate 102 can be, for example, an organic build-up substrate or a ceramic single or multi-chip module.

A coolant (a liquid) may be supplied to each of the channel inlets of expanding fluid channels 113. A nozzle (not illustrated) may be used to provide flow restriction of the coolant to the expanding fluid channels 113. The coolant may pass between the TSVs 108 and provide the two-phase cooling to cool the chip stack 106. The coolant may exit the expanding fluid channels 113 as a liquid/vapor combination at the channel outlets. The coolant (in liquid form) is represented by solid black arrows and as outlined arrows after passing through the expanding fluid channels 113. The coolant may be supplied to the channel inlet through the manifold 104 starting at an inlet port and may exit the manifold 104 at an outlet port.

Figure 2:
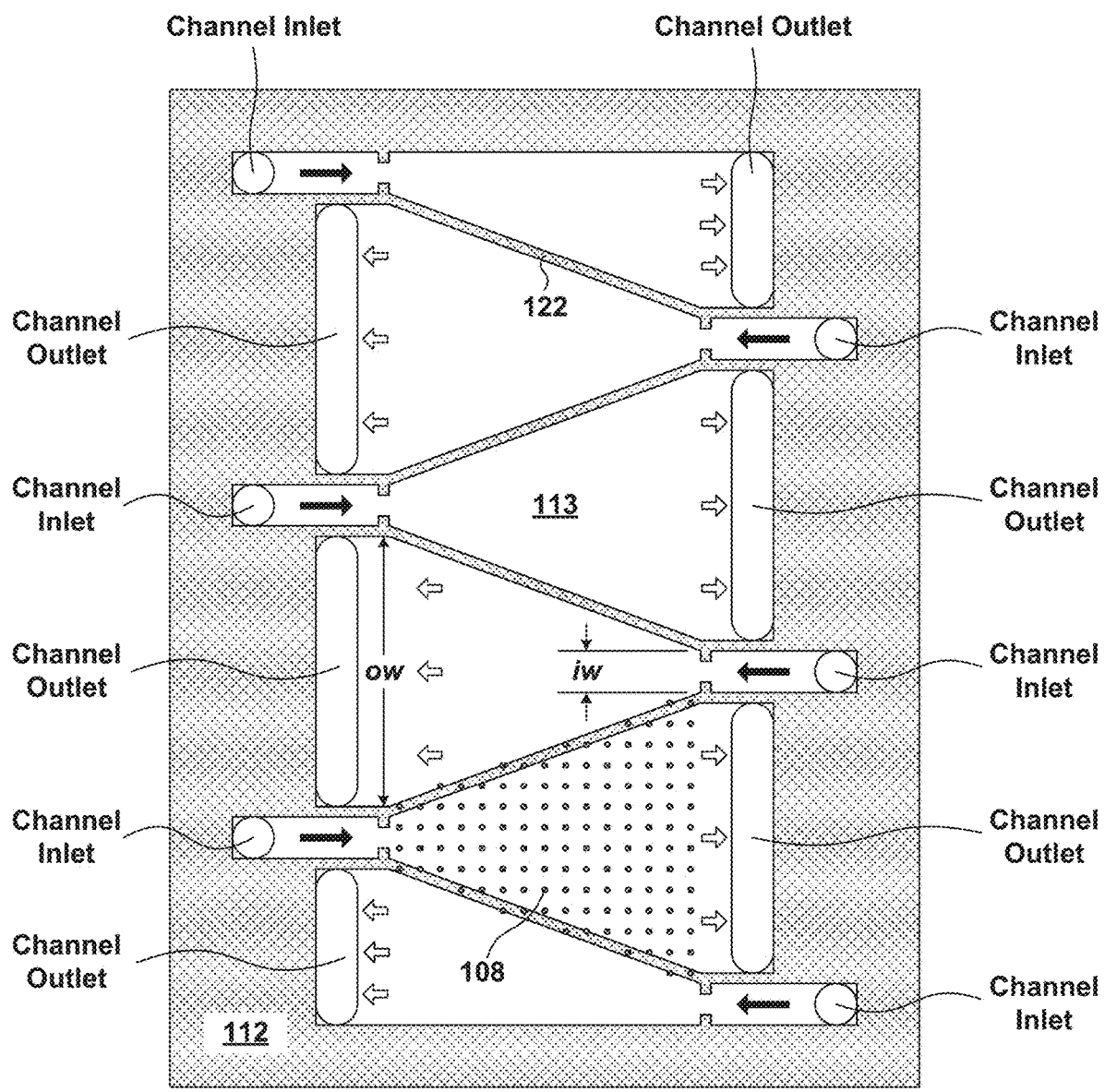
FIG. 2 is a cross sectional top view of an interposer cold plate with expanding channels, according to an exemplary embodiment.

With reference to FIG. 2, a demonstrative illustration of the interposer cold plate 112 and the expanding fluid channels 113 is provided, according to an embodiment. FIG. 2 is a top view of the interposer cold plate 112 taken along cross sectional line A-A of FIG. 1. In the exemplary embodiment, six expanding fluid channels 113 are illustrated in a staggered arrangement, but any number of expanding fluid channels 113 in a variety of arrangements may be used. It should be noted, the TSVs 108 are only illustrated in one of the expanding fluid channels 113 for illustrative purposes and may be present in more than one, or all, expanding fluid channels 113.

A coolant flows into the expanding fluid channels 113 from the channel inlets, passing through the expanding fluid channels 113, and exiting at the channel outlets. The expanding fluid channels 113 having dimensions defined by the location of the channel inlets/outlets and the channel walls 122. The coolant may enter an opening into the expanding fluid channels 113 having an inlet width (1w) and may exit the expanding fluid channels 113 at an opening having an outlet width (ow). To achieve the expanding nature of the expanding fluid channels 113, the inlet width (iw) may be less than the outlet width (ow).

Having expanding channels can result in a reduction of vapor-liquid acceleration, compared to straight channels. This reduction in vapor-liquid acceleration, in turn, reduces pressure drops and improves the critical heat flux. A benefit of expanding channels is that the flow speed (and pressure drop) is reduced as the channel cross-section increases, thus maintaining an annular regime with a relatively thick evaporating film along surfaces of flow cavities. Another benefit may include the elimination of an inlet hole needing to be fabricated in a radial design. A further benefit is a reduction in the flow instabilities observed in non-expanding channels, such as hot spot formation.

Figure 5:
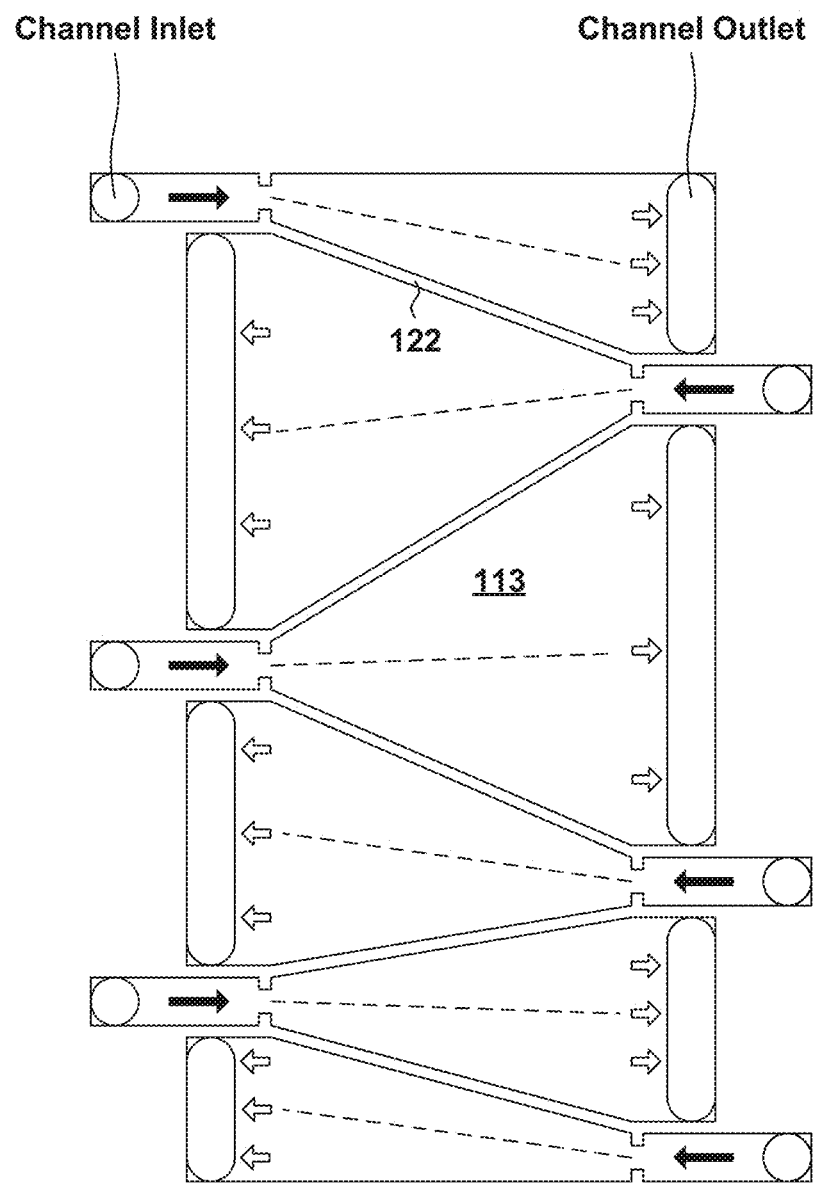
FIG. 5 is a cross sectional top view of the interposer cold plate with expanding channels and illustrates an alternative design for the expanding channels, according to an exemplary embodiment.

In other embodiments of the invention, the expanding channels 113 may be patterned or textured to reduce surface superheat. Moreover, the expanding channels 113 may be varied in size to correspond with different power densities by chip layer or location on a given chip (FIG. 5). In another embodiment, the expanding channels 113 can vary in configuration relative to one another to specifically direct liquid coolant/refrigerant to hot spot locations (FIG. 6) and may be supplied from more than two sides of the interposer cold plate 112 (FIG. 7). A flow channel network can be designed to focus multiple channels to one or more hot spot locations.

Figure 3:
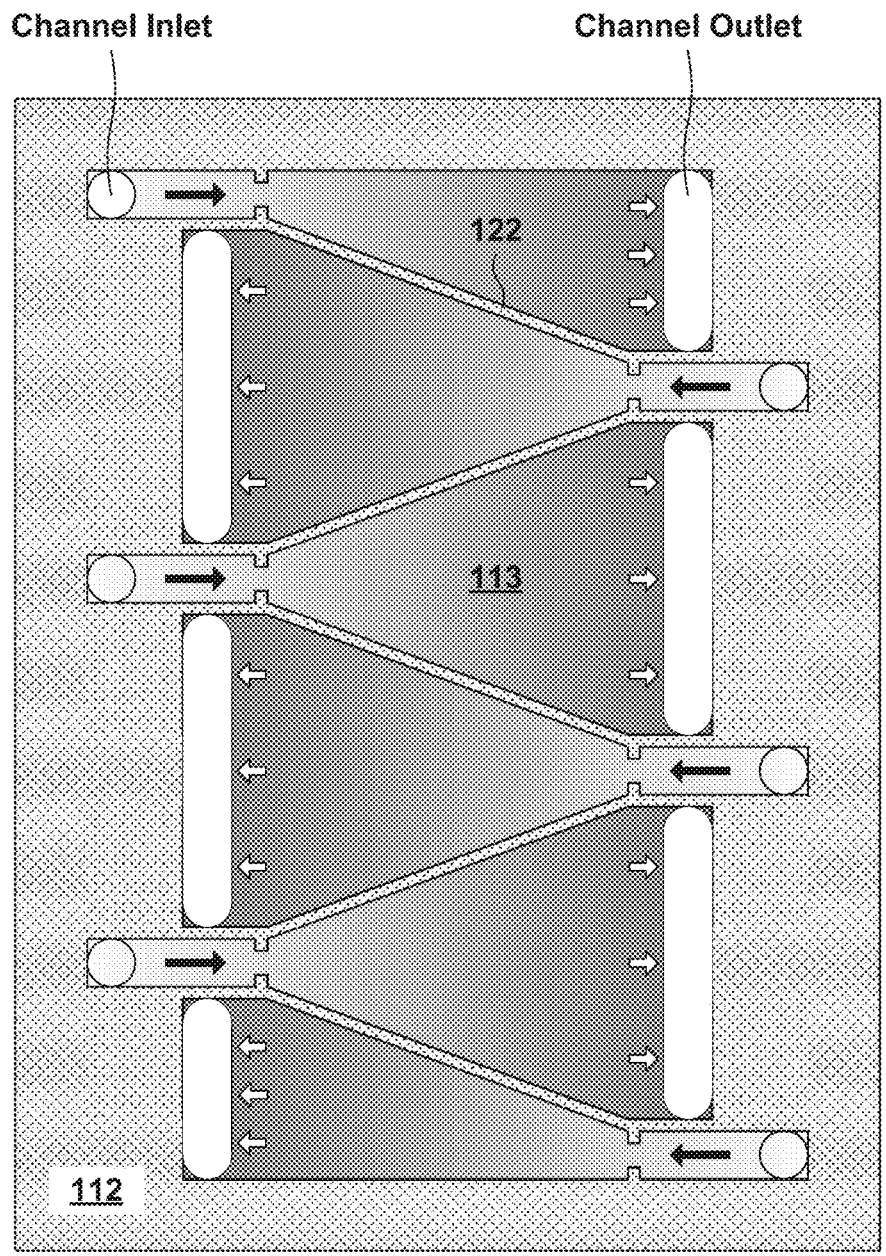
FIG. 3 is a cross sectional top view of the interposer cold plate with expanding channels and illustrates temperature zones in the expanding channels, according to an exemplary embodiment.

With reference to FIG. 3, a demonstrative illustration of the expanding fluid channels 113 in the interposer cold plate 112 is provided, according to an embodiment. More specifically, the heat distribution is illustrated as the coolant passes through the expanding fluid channels 113.

The heat distribution of the two-phase liquid coolant is shown as shades of gray, where the light gray represents a lower temperature (e.g., a liquid) and the darker gray represents a higher temperature (e.g., a liquid/vapor combination). As illustrated, cooling effects are distributed more evenly, from inlet to outlet, as compared to known designs. As the liquid coolant flows through the expanding fluid channels 113, the liquid evaporates resulting in a variety of flow patterns, for example, annular, turbulent, or any other flow pattern.

Figure 4:
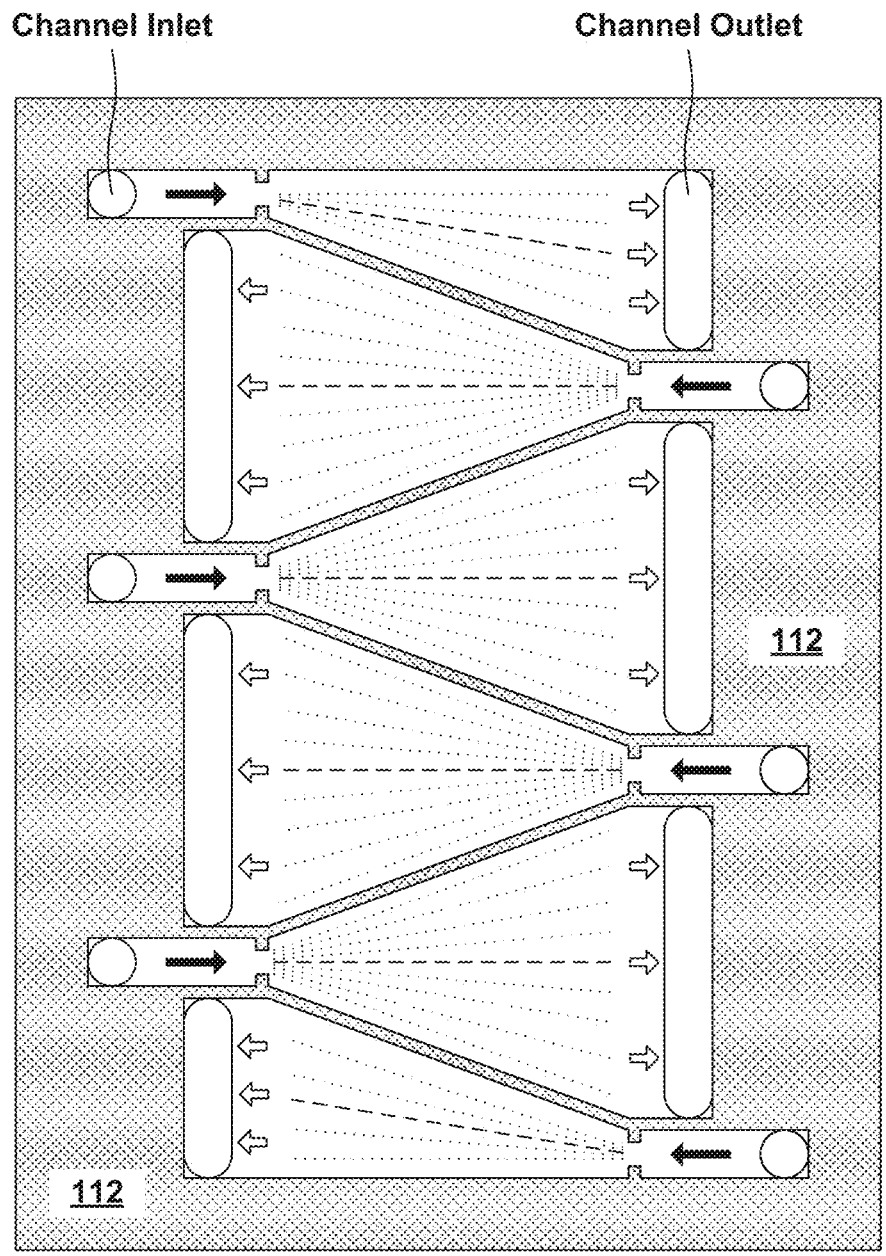
FIG. 4 is a cross sectional top view of the interposer cold plate with expanding channels and illustrates an average path of travel of coolant through the expanding channels, according to an exemplary embodiment.

With reference to FIG. 4, a demonstrative illustration of the expanding fluid channels 113 in the interposer cold plate 112 is provided, according to an embodiment. More specifically, the figure illustrates the flow path of the coolant as it passes through the expanding fluid channels 113. The dotted lines represent a few flow paths depending on the shape of the expanding fluid channels 113. The dashed line represents an average flow path through each expanding fluid channel 113. Some of the average flow path lines may be parallel to one another, while other average flow path lines may not be parallel.

With reference to FIG. 5, a demonstrative illustration of the expanding fluid channels 113 in the interposer cold plate 112 is provided, according to an embodiment. More specifically, an alternative embodiment of the expanding fluid channels 113 is illustrated. As stated above, the expanding fluid channels 113 can be designed with varied inlet and outlet sizes to account for hotspot areas. As the ratio of inlet width (iw) to outlet width (ow) gets closer to 1:1, the vapor-liquid acceleration may increase while providing a lower temperature to portions of the chip stacks that are closer to the outlet. In turn, when the ratio of inlet width (iw) to outlet width (ow) gets farther from 1:1, the vapor-liquid acceleration may decrease, but the liquid coolant associated with the given inlet will have to cool a larger area. The amount of coolant provided to each zone relative to the other zones can also be modulated by selecting appropriate nozzle dimensions.

Figure 6:
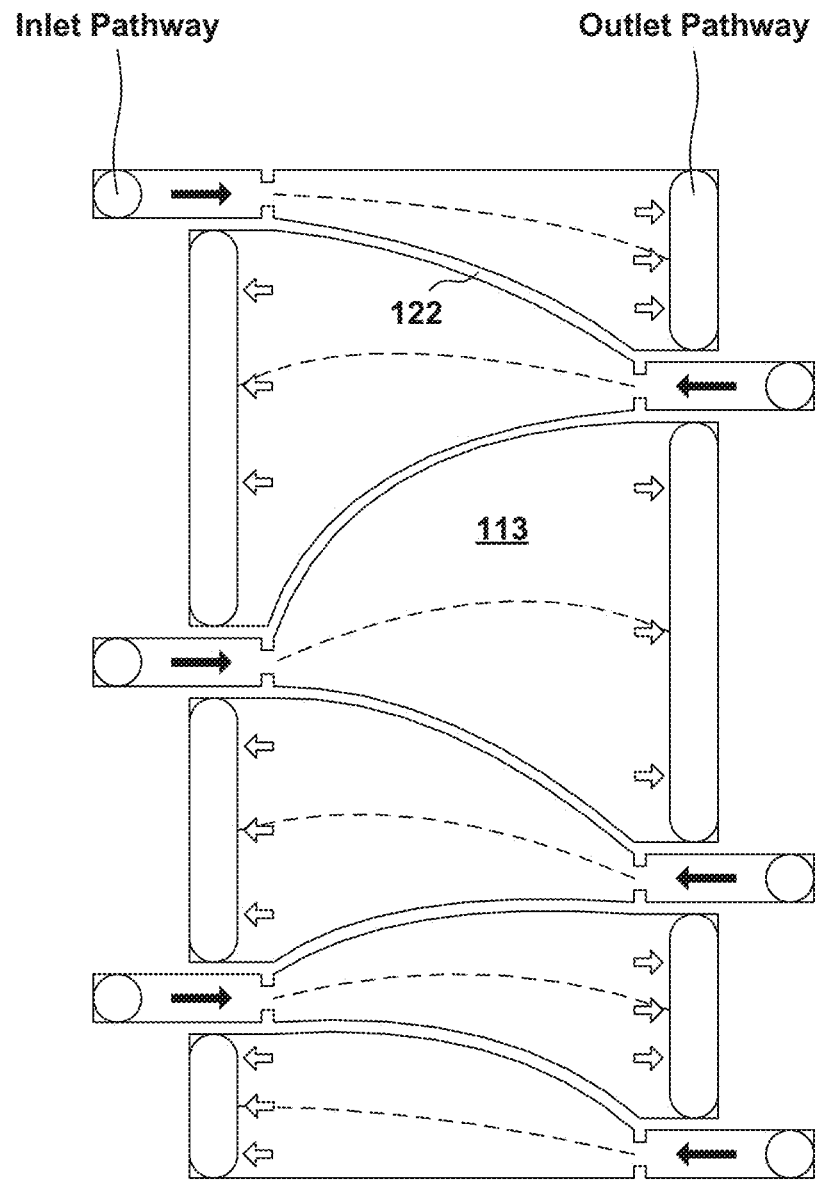
FIG. 6 is a cross sectional top view of the interposer cold plate with expanding channels and illustrates an alternative design for the expanding channels, according to an exemplary embodiment.
Figure 7:
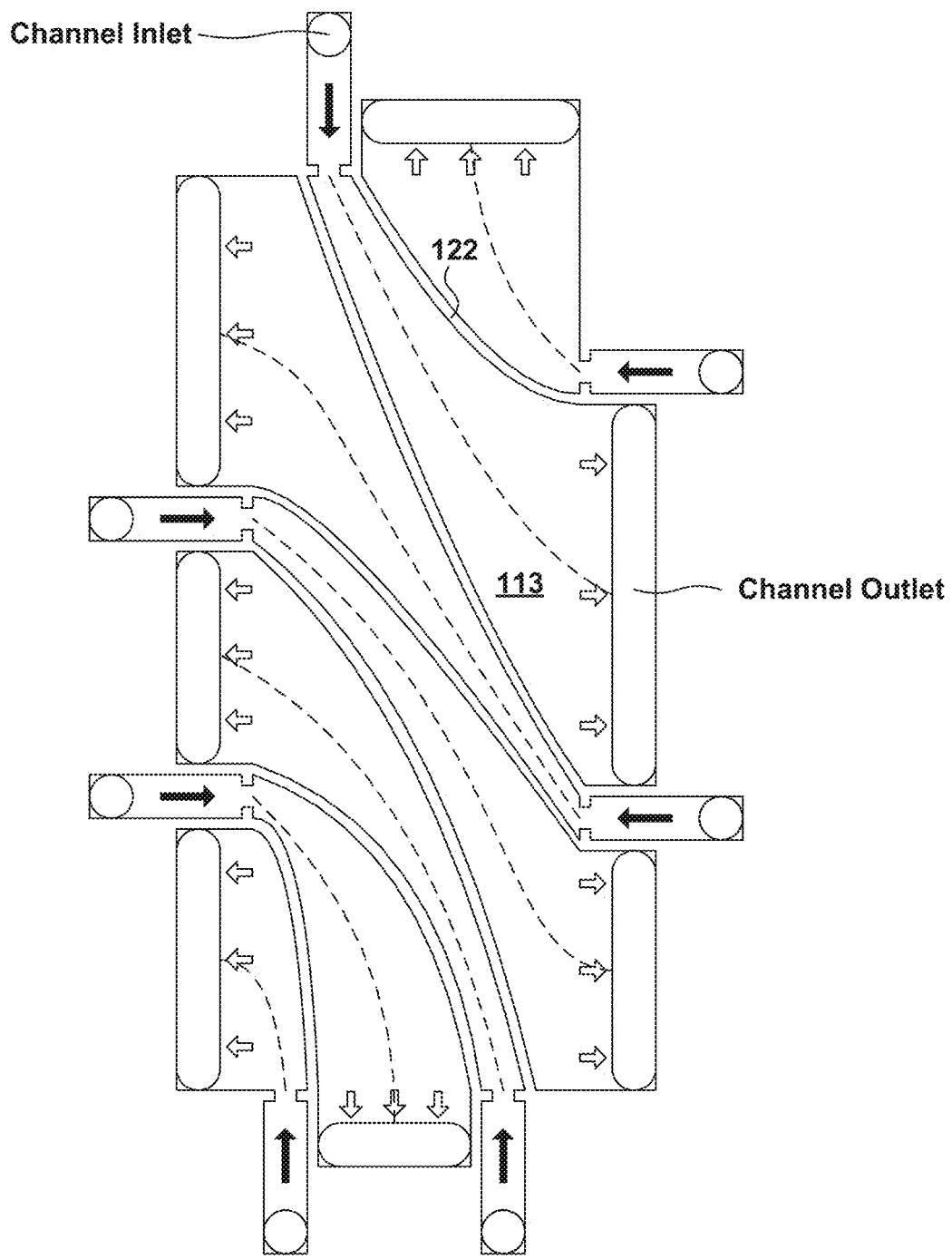
FIG. 7 is a cross sectional top view of the interposer cold plate with expanding channels and illustrates an alternative design for the expanding channels, according to an exemplary embodiment.

With reference to FIG. 6, a demonstrative illustration of the expanding fluid channels 113 in the interposer cold plate 112 is provided, according to an embodiment. More specifically, an alternative embodiment of the expanding fluid channels 113 having curved channel walls 122 may be used. As chip layouts become more complex, the expanding fluid channels 113 can be designed to provide more efficient pathways between the inlet and outlet openings given an understanding of the expected power distribution/map.

With reference to FIG. 7, a demonstrative illustration of the expanding fluid channels 113 in the interposer cold plate 112 is provided, according to an embodiment. More specifically, an alternative embodiment of the expanding fluid channels 113 having inlet and outlet pathways on more than two sides of the interposer cold plate 112 is possible. As chip layouts become more complex, the expanding fluid channels 113 can be designed to provide more efficient pathways between the inlet and outlet openings.

Figure 8:
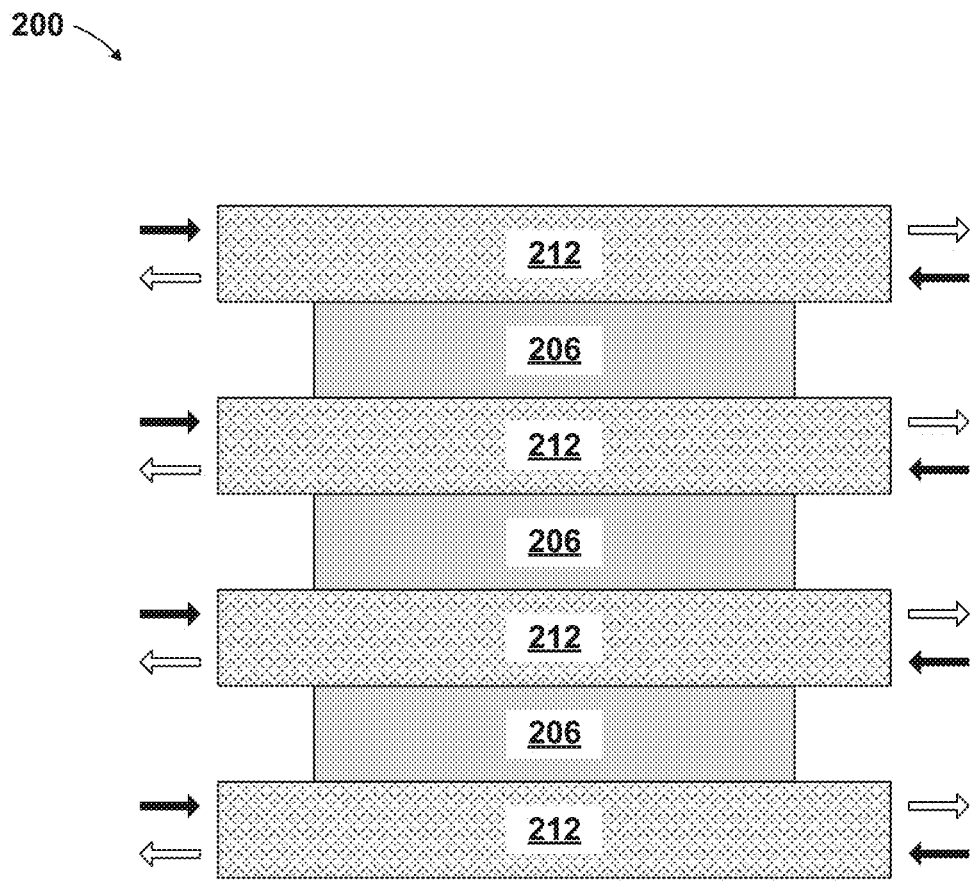
FIG. 8 is a cross section view of a chip stack with multiple interposer cold plates, according to an exemplary embodiment.

With reference to FIG. 8, a demonstrative illustration of an alternative structure 200 is provided, according to an embodiment. More specifically, the structure 200 is an alternative layout having multiple chips or chip stacks 206 between more than two interposer cold plates 212. It should be noted, the interposer cold plates 212 may be similar to the interposer cold plate 112 described in reference to FIG. 1.

Figure 9:
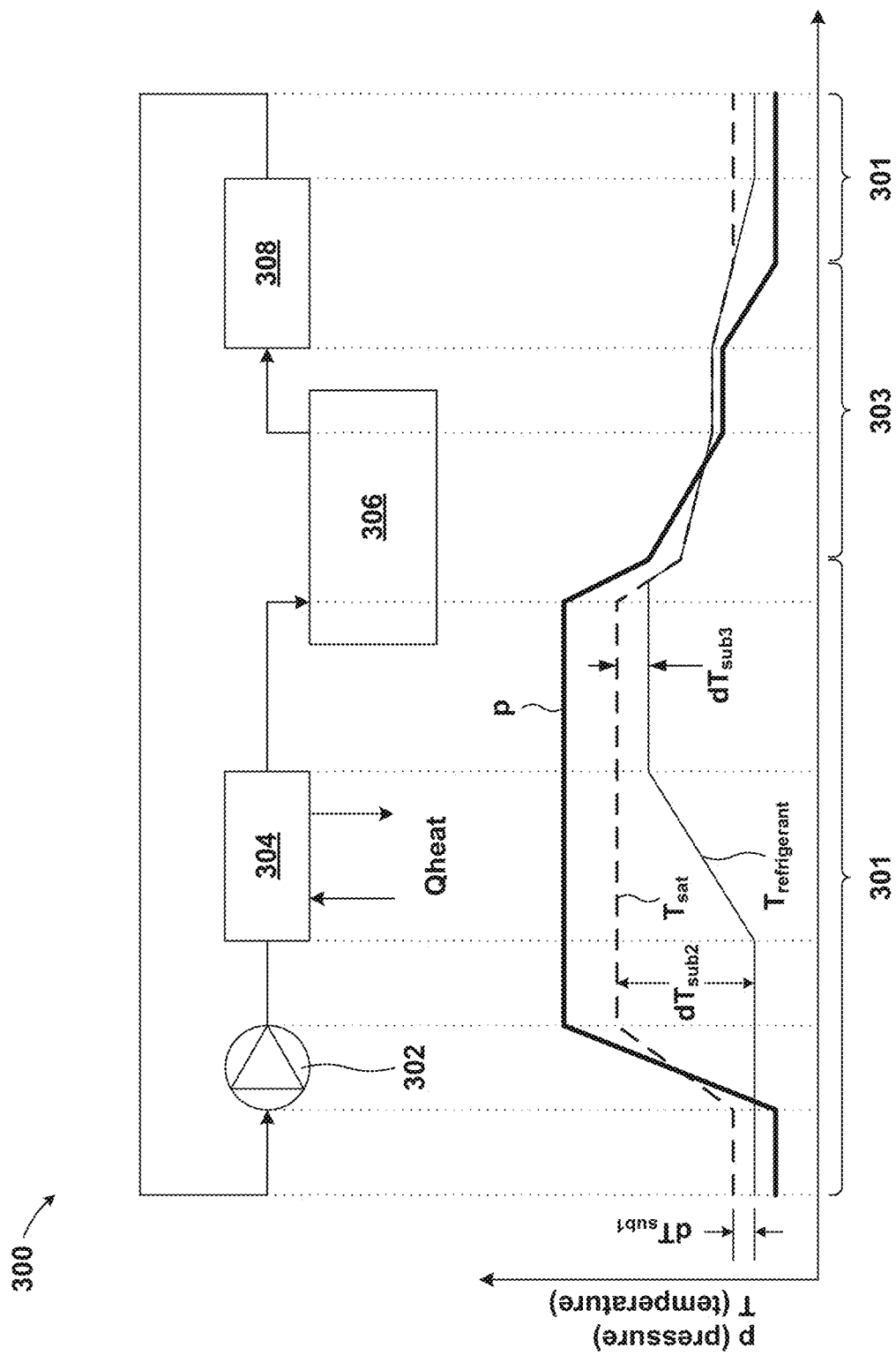
FIG. 9 is a block diagram and graph illustrating a cooling loop, according to an exemplary embodiment.

With reference to FIG. 9, a demonstrative illustration of a pumped two-phase loop 300 is provided, according to an embodiment. More specifically, if a pump 302 is used, the coolant would generally need to be entirely liquid to limit cavitation and avoid vapor at channel inlets and orifices. It should be noted, a pressure and temperature chart has been provided below a block diagram to illustrate the temperature and pressure changes as the coolant flows through the pumped two-phase loop 300.

The pumped two-phase loop 300 can include the coolant flowing through the pump 302, to a pre-heater 304, module 306, and a condenser 308. The pre-heater 304 may help with heat transfer efficiency when the coolant passes through the module 306. The pre-heater 304 may be the backside cold plate 114. The module 306 may be a structure similar to structure 100 (described in reference to FIG. 1). The condenser 308 may condense the coolant from vapor to liquid, where the liquid coolant is then resupplied to the pump 302.

The slight sub-cooling needed before the coolant passes through the pump 302 is represented by $dT_{sub1}$. Pressure lifts by the pump 302 increases the sub-cooling to $dT_{sub2}$. If the module 306 includes chip cooling, two-phase heat transfer may be required across the entire chip. Hence, coolant pre-heating may be required to reduce sub-cooling to $dT_{sub3}$. Flashing may occur after the pressure drop across an integrated nozzle.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure for cooling an integrated circuit comprising:
    an interposer cold plate having expanding channels, each expanding channel having a flow direction from a channel inlet to a channel outlet, the flow direction being different for at least two of the expanding channels, a width of each channel inlet being less than a width of each channel outlet such that a width of each expanding channel increases across its entire length, and wherein the channel inlets and the channel outlets are located on more than two sides of the interposer cold plate.

2. The structure of claim 1, wherein the expanding channels are arranged in an alternating arrangement, wherein directly adjacent expanding channels have opposing flow directions.

3. The structure of claim 1, wherein the channel inlet of at least one fluid channel is offset from the channel outlet of the at least one fluid channel.

4. The structure of claim 1, wherein the channel inlet of at least one fluid channel is arranged 90 degrees from the channel outlet of the at least one fluid channel.

5. The structure of claim 1, further comprising:
    a plurality of through silicon vias electrically connect the integrated circuit to a substrate, wherein the plurality of through silicon vias pass through the interposer cold plate.

6. The structure of claim 1, further comprising:
    a backside cold plate located on an opposite side of the integrated circuit as the interposer cold plate, wherein a cooling fluid passes through the backside cold plate before entering the interposer cold plate at the channel inlets.

7. The structure of claim 1, wherein at least two or more interposer cold plates are separated by at least one electronic device.

8. A structure for cooling a chip comprising:
    a single heat transfer structure thermally coupled to the chip, wherein the single heat transfer structure comprises expanding coolant channels, wherein each expanding coolant channel has a flow direction from a channel inlet to a channel outlet, wherein the flow direction of one of the expanding coolant channels is in a different direction than another one of the expanding coolant channels, wherein a width of each channel inlet is less than a width of each channel outlet such that a width of each expanding coolant channel increases across its entire length, and wherein the channel inlets and the channel outlets are located on more than two sides of the single heat transfer structure; and
    a manifold providing an inlet pathway to the channel inlets of the expanding coolant channels and an outlet pathway from the channel outlets of the expanding coolant channels.

9. The structure of claim 8, wherein the expanding coolant channels are arranged in an alternating arrangement, wherein directly adjacent expanding coolant channels have opposing flow directions.

10. The structure of claim 8, wherein the channel inlet of at least one fluid channel is offset from the channel outlet of the at least one fluid channel.

11. The structure of claim 8, wherein the channel inlet of at least one fluid channel is arranged 90 degrees from the channel outlet of the at least one fluid channel.

12. The structure of claim 8, wherein the chip is electrically connected to a substrate through a through silicon via (TSV), and wherein the TSV provides structural support for the chip.

13. The structure of claim 8, further comprising:
    a backside cold plate thermally coupled to an opposite side of the chip as the single heat transfer structure, wherein coolant passes through the backside cold plate before entering the channel inlets of the single heat transfer structure, and wherein the inlet pathway of the manifold connects the channel inlets of the single heat transfer structure and channel inlets of the backside cold plate, and the outlet pathway connects the channel outlets of the single heat transfer structure and channel outlets of the backside cold plate.

14. The structure of claim 8, wherein at least two or more of the single heat transfer structures are separated by at least one chip.

15. A chip cooling structure comprising:
    an interposer cold plate thermally coupled to a bottom of a chip stack comprising fluid channels, each fluid channel extending from an inlet on one side of the interposer cold plate to an outlet on another side of the interposer cold plate, wherein the inlet of each fluid channel is smaller than the outlet of each fluid channel such that a width of each fluid channel increases along its entire length, and wherein the channel inlets and the channel outlets are located on more than two sides of the interposer cold plate; and wherein the channel inlet of at least one fluid channel is offset from the channel outlet of the at least one fluid channel, the channel inlet of at least one fluid channel is arranged 90 degrees from the channel outlet of the at least one fluid channel.

16. The structure of claim 15, further comprising:
a manifold comprising a first fluid path from an inlet port to the inlets of the interposer cold plate and a second fluid path from an outlets of the interposer cold plate to an outlet port.

17. The structure of claim 15, further comprising:
a backside cold plate thermally coupled to a top of the chip stack comprising fluid channels extending in a straight line from an inlet on one side of the interposer cold plate to an outlet on an opposite side of the interposer cold plate; and
a manifold comprising a first fluid path from an inlet port to both the inlets of the interposer cold plate and the inlets of the backside cold plate, and a second fluid path from both the outlets of the interposer cold plate and the outlets of the backside cold plate to an outlet port.

18. The structure of claim 15, wherein the inlets of the interposer cold plate and the outlets of the interposer cold plate are arranged perpendicular to a length of the fluid channels.

19. The structure of claim 15, wherein a width of each fluid channel is parallel to a bottom of the chip stack.

20. The structure of claim 15, further comprising:
a plurality of through silicon vias electrically connect the chip stack to a laminate substrate, wherein the plurality of through silicon vias pass through the interposer cold plate.

* * * * *